US012782442B2

(12) United States Patent
Elmiger et al.

(10) Patent No.: US 12,782,442 B2
(45) Date of Patent: Nov. 3, 2026

(54) DETECTING WELDED RELAY CONTACTS USING MEASUREMENT AFTER CURRENT BREAK

(71) Applicant: Rockwell Automation Technologies, Inc., Mayfield Heights, OH (US)

(72) Inventors: David Elmiger, Hitzkirch (CH); Kyle B. Adkins, Oak Creek, WI (US); Andrew E. Carlson, Franklin, WI (US); David M. Messersmith, Kenosha, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 558 days.

(21) Appl. No.: 18/338,912

(22) Filed: Jun. 21, 2023

(65) Prior Publication Data

US 2024/0426913 A1 Dec. 26, 2024

(51) Int. Cl.
*G01R 31/327* (2006.01)
*H01H 1/00* (2006.01)
*H01H 47/00* (2006.01)

(52) U.S. Cl.
CPC ....... *G01R 31/3278* (2013.01); *H01H 1/0015* (2013.01); *H01H 47/002* (2013.01); *H01H 2047/003* (2013.01)

(58) Field of Classification Search
CPC ............. G01R 31/3278; H01H 1/0015; H01H 47/002; H01H 2047/003
See application file for complete search history.

(56) References Cited

U.S. PATENT DOCUMENTS 4,914,315 A 4/1990 Nickolai
5,243,336 A * 9/1993 Noonan ............... H01H 47/002 340/3.8
5,774,323 A * 6/1998 Innes ................... H01H 47/002 361/187
8,901,934 B2 12/2014 Namou et al.
2008/0089000 A1 4/2008 Drake
2009/0228163 A1 9/2009 Tarchinski
2014/0340804 A1* 11/2014 Ward ..................... H01H 51/01 335/137
2015/0054517 A1 2/2015 Yonezaki
(Continued)

FOREIGN PATENT DOCUMENTS

CN 112041694 A 12/2020
CN 110140056 B 4/2021
(Continued)

OTHER PUBLICATIONS

Elmiger, et al; U.S. Appl. No. 17/660,711, filed Apr. 26, 2022.

*Primary Examiner* — Lee E Rodak
*Assistant Examiner* — Zannatul Ferdous

(57) ABSTRACT

A system includes a relay system and a controller. The relay system includes a relay having a first contact on an input side of the relay, the input side coupled to a power source, and a second contact on a load side of the relay coupled to a load. The controller is configured to monitor a current flow from the power source through the relay, transmit a close signal to the relay, and to transmit an open signal to the relay. Based on the current flow through the relay following the open signal, determine whether an electrical weld of one of the first contact and the second contact of the relay exists.

20 Claims, 7 Drawing Sheets

(56) References Cited

U.S. PATENT DOCUMENTS

| | | | | |
|---|---|---|---|---|
| 2015/0137819 | A1 | 5/2015 | Giordano | |
| 2015/0191088 | A1* | 7/2015 | Gonzales | G01R 31/3278 701/34.2 |
| 2015/0346282 | A1 | 12/2015 | Jeon | |
| 2016/0009189 | A1 | 1/2016 | Yoshizawa | |
| 2017/0317628 | A1* | 11/2017 | Renner | B23K 9/1006 |
| 2017/0368951 | A1* | 12/2017 | Adlhoch | B60L 53/00 |
| 2018/0158633 | A1 | 6/2018 | Brandt | |
| 2018/0315565 | A1 | 11/2018 | Zhang | |
| 2023/0101428 | A1 | 3/2023 | Adkins et al. | |
| 2023/0131949 | A1 | 4/2023 | Kataoka | |
| 2023/0213582 | A1 | 7/2023 | Buescher | |
| 2023/0343533 | A1 | 10/2023 | Elmiger | |

FOREIGN PATENT DOCUMENTS

| | | | |
|---|---|---|---|
| DE | 10160106 | A1 | 6/2002 |
| DE | 102006054294 | B4 | 4/2009 |
| JP | H09289792 | A | 11/1997 |
| JP | 5370553 | B1 | 9/2013 |
| KR | 20140061637 | A | 5/2014 |

* cited by examiner

DETECTING WELDED RELAY CONTACTS USING MEASUREMENT AFTER CURRENT BREAK

RELATED APPLICATIONS

This application is related to co-pending U.S. application, 18/338,870 entitled "DETECTING WELDED RELAY CONTACTS USING ELECTRICAL PULSE," filed concurrently, which is hereby incorporated by reference in its entirety for all purposes.

This application is related to co-pending U.S. application, Ser. No. 18/338,940 entitled "DETECTING WELDED RELAY CONTACTS USING CONTACT CLOSE TIME MEASUREMENT," filed concurrently, which is hereby incorporated by reference in its entirety for all purposes.

This application is related to co-pending U.S. application, Ser. No. 18/338,960 entitled "DETECTING WELDED RELAY CONTACTS USING SPANNER VOLTAGE MEASUREMENT," filed concurrently, which is hereby incorporated by reference in its entirety for all purposes.

TECHNICAL BACKGROUND

In modern industrial environments relay systems are commonly used to control the supply of power to industrial equipment such as motors and the like. These relay systems commonly include a plurality of individual relays. For example, a relay system to control three-phase electrical power supplied to a piece of equipment typically includes one or more relay for each phase of the electrical power.

Over repeated operation of relay systems, materials within the contacts of the individual relays may segregate, resulting in increased concentrations of particular metal elements within small regions of the contacts. Eventually this segregation may result in metal migration such that a relay contact is welded shut.

In double break contact relays, where each relay includes two contacts, it is straightforward to determine when both contacts of the relay are shorted. However, in situations where only one of the contacts within the relay is welded detection of the weld is much more difficult.

SUMMARY

In an implementation, a system includes a relay system and a controller. The relay system includes a relay having a first contact on an input side of the relay, the input side coupled to a power source, and a second contact on a load side of the relay is coupled to a load.

The controller includes one or more processors and a memory having stored thereon instructions that, upon execution by the one or more processors, cause the one or more processors to perform a weld detection check.

The weld detection check includes monitoring a current flow from the power source through the relay, transmitting a close signal to the relay, and transmitting an open signal to the relay.

Based on the current flow through the relay following the open signal, the controller determines whether an electrical weld of one of the first contact and the second contact of the relay exists.

In another implementation, a method for detecting a welded relay contact by performing a weld detection check, includes closing a relay, wherein the relay comprises a first contact on an input side of the relay and a second contact on a load side of the relay, and wherein the input side of the relay is coupled to a power source, and the load side of the relay is coupled to a load.

The method also includes opening the relay, and measuring a current flow through the relay in response to opening the relay. Based on the current flow through the relay, the method determines whether an electrical weld of one of the first contact and the second contact of the relay exists.

BRIEF DESCRIPTION OF THE DRAWINGS

Many aspects of the disclosure may be better understood with reference to the following drawings. While several implementations are described in connection with these drawings, the disclosure is not limited to the implementations disclosed herein. On the contrary, the intent is to cover all alternatives, modifications, and equivalents.

FIG. 3 illustrates an example relay system including a single weld.

FIG. 4 illustrates the example relay system of FIG. 3 as a close signal is transmitted to the relay.

FIG. 5 illustrates the example relay system of FIG. 4 as the relay closes in response to the close signal.

FIG. 6 illustrates the example relay system of FIG. 5 as an open signal is transmitted to the relay.

DETAILED DESCRIPTION

The following descriptions of various example embodiments and implementations of a system and method for the detection of welded relay contacts using electrical pulses. As discussed above, relay systems are commonly used in the control of industrial machines. In some example embodiments, relay systems are used within motor starter controllers. These devices are used to start industrial electrical motors powered by a multi-phase power source. Typically, these power sources have three phases of alternating current (AC) power with each phase offset from the others by 120° and require relay systems having three or more relays.

When a relay is shorted within such a controller, a reversing device will suffer a line-to-line short circuit of two phases of the power source internally if a relay on the reversing phases welds. This results in a catastrophic failure and the controller may be damaged or destroyed by the event. While this example embodiment, describes a motor starter controller, many other similar controllers and their associated industrial machines suffer similar failures if a weld is undetected and the relay shorts.

In this example embodiment, single welded double break relay contacts are detected by monitoring the current flowing through the relay during open and close operations of the relay. Initially, the relay is closed and current flows normally through the relay. Then and open signal is transmitted to the relay and the relay opens. If the relay is partially welded its response to the open signal is different from that of a non-welded relay and this different response is detectable by monitoring the current flow through the relay.

After the open signal is applied to the relay and the relay opens, if current continues to flow through the relay, this indicates that a weld exists on at least one of the contacts of the relay.

Other example embodiments measure the voltage across the relay (between the contacts of the relay) to detect welds. After the open signal is transmitted to the relay, a relay with a weld will attempt to open, but bounce back closed one or more times. This failure is detected by monitoring the voltage across the relay and detecting if the voltage returns to zero after the open signal is transmitted to the relay.

This solution for detecting single welded relays provides a technical advantage by detecting these failures before they cause short circuits within the controller. This early detection allows a user to replace the controller before a potentially destructive failure of the controller.

Figure 1:
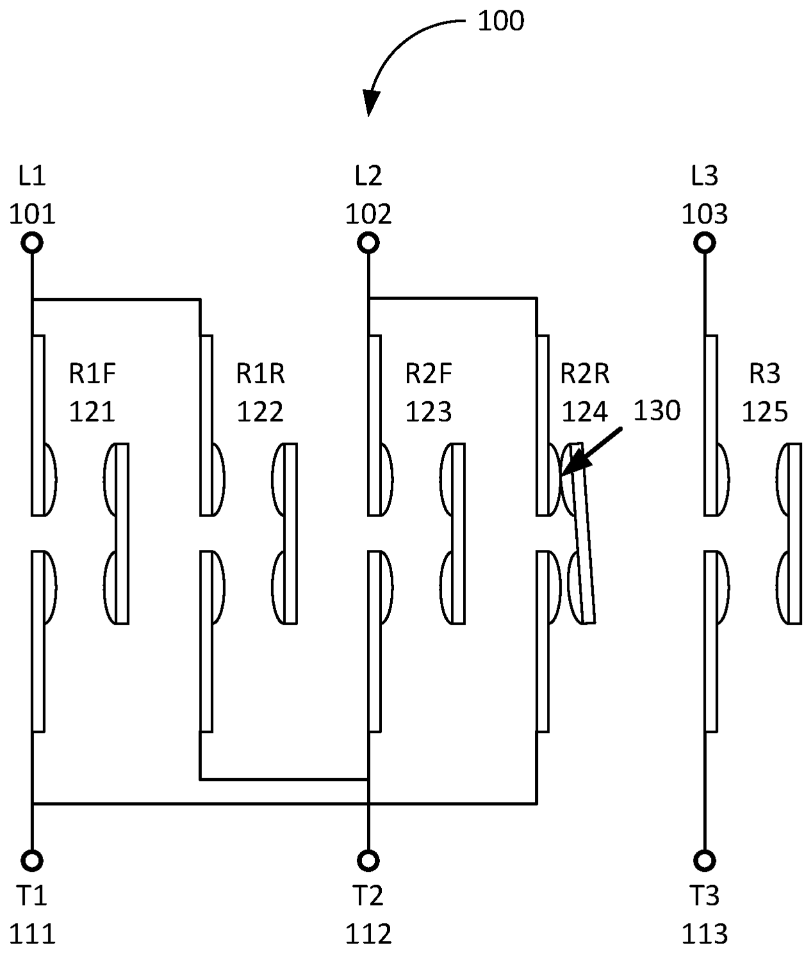
FIG. 1 illustrates an example relay system including a single weld.

FIG. 1 illustrates an example relay system 100 including a single weld 130. In this example embodiment, relay system 100 includes five relays: R1F 121, R1R 122, R2F 123, R2R 124, and R3 125. Relay system 100 includes three inputs: L1 101, L2 102, and L3 103, along with three outputs: T1 111, T2 112, and T3 113. When used in a motor starter controller, inputs L1 101, L2 102, and L3 103 are each coupled to a phase of a three-phase power source, and outputs T1 111, T2 112, and T3 113 are each coupled to a phase of an electric motor.

In this example, all of the relays: R1F 121, R1R 122, R2F 123, R2R 124, and R3 125 are off. However, relay R2R 124 has a first contact 130 which is welded shut.

Figure 2:
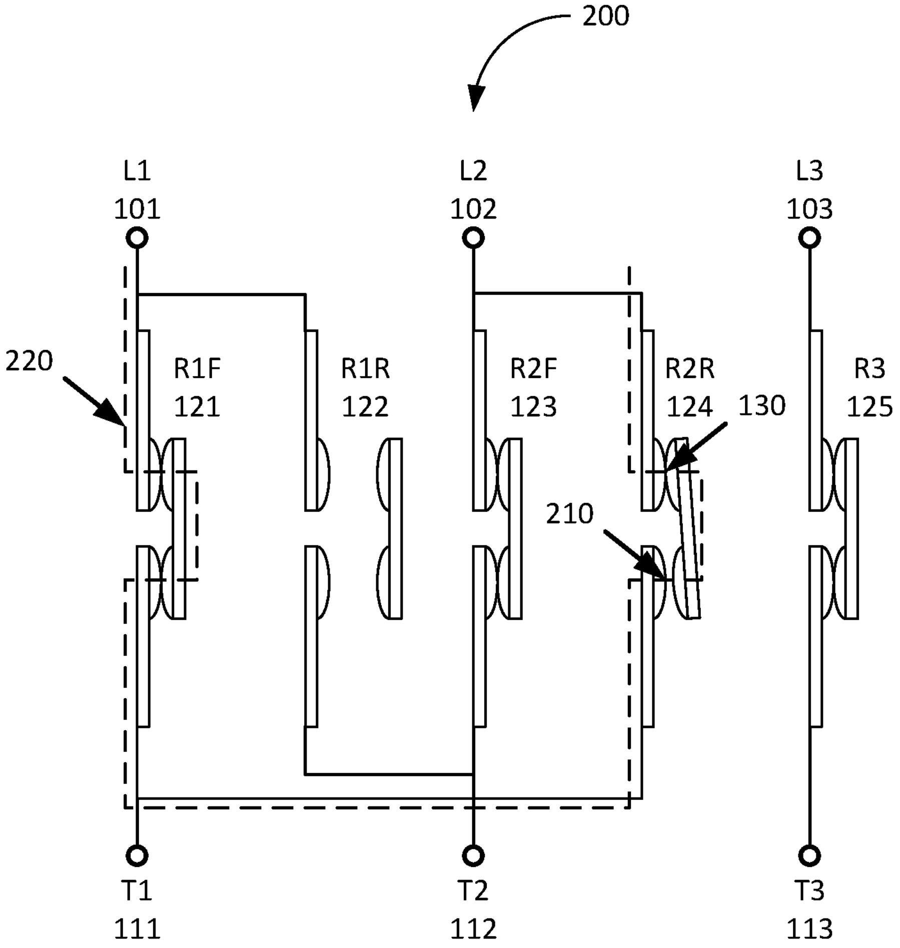
FIG. 2 illustrates the example relay system of FIG. 1 during operation where the single weld causes a short circuit.

FIG. 2 illustrates the example relay system 200 of FIG. 1 during operation where the single weld causes a short circuit. In this example embodiment, relays R1F 121, R2F 123, and R3 125 are all closed in order to drive the electric motor in a forward direction. Here, a first relay (R1F 121) is illustrated with a first contact 212 on an input side (L1 101) of the first relay, and a second contact 214 on a load side (T1 111) of the first relay.

A second relay (R2R 124) is also illustrated with a first contact 130 on an input side (L2 102) of the second relay, and a second contact 210 on a load side (T2 112) of the second relay. In this example, the first contact 130 of the second relay R2R 124 is welded.

Since the first contact 130 of the second relay R2R 124 is welded, the second contact 210 of the second relay R2R 124 has a much smaller than normal gap, and when voltage is applied, an arc may form across that gap and short the second relay R2R 124. This causes a short circuit between two phases of the input power source L1 101 and L2 102 as current flows through path 220. This short circuit may result in substantial damage to the power source and other equipment connected to relay system 200.

FIGS. 3-6 illustrate an example relay system during a series of steps performed during a method for detecting a welded relay contact by performing a weld detection check.

Figure 3:
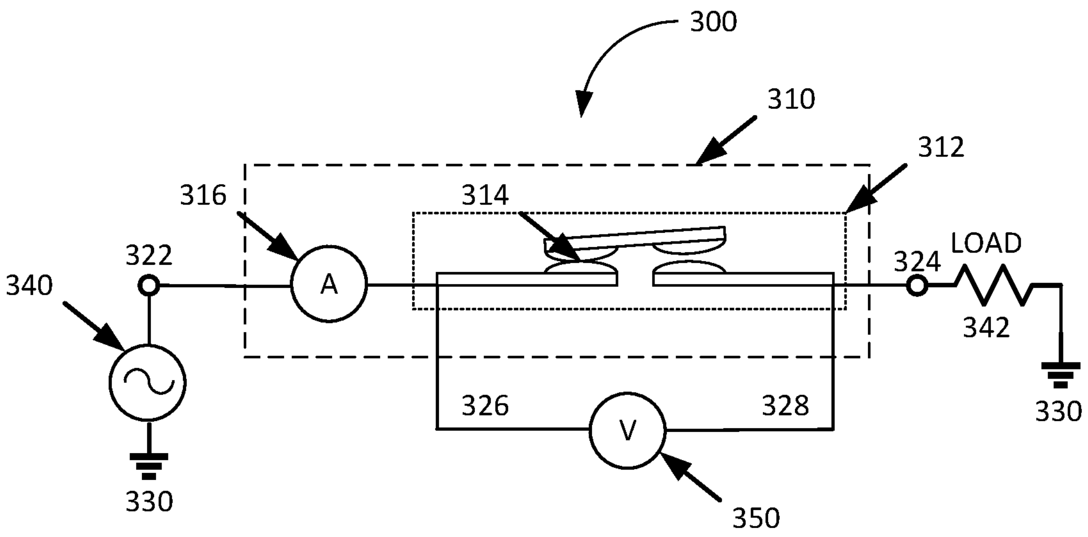
FIGS. 3-6 illustrate an example relay system during a series of steps performed during a method for detecting a welded relay contact by performing a weld detection check.

FIG. 3 illustrates an example relay system 310 including a single weld 314. In this example embodiment, a simple relay system 310 within industrial automation environment 300 is illustrated with a single relay 312. In actual practice relay system 310 typically includes a plurality relays, and the method illustrated in FIGS. 3-6 is performed sequentially on some or all of the relays within relay system 310.

In this example, relay system 310 includes current sensor 316. This current sensor 316 utilizes any of a wide variety of configurations and implementations while serving to detect welds. Here, relay system 310 includes input 322 coupled to power source 340 which includes a connection to ground 330. The load side 324 of relay 312 within relay system 310 is connected to LOAD 342 representing a load within an industrial machine within industrial automation environment 300, such as an electrical motor. Voltage sensor 350 is coupled to relay 312 at nodes 326 and 328 is a configuration to measure a voltage across relay 312. This voltage sensor 350 utilizes any of a wide variety of configurations and implementations while serving to detect welds. In this example, a first contact 314 of relay 312 is welded shut.

Figure 4:
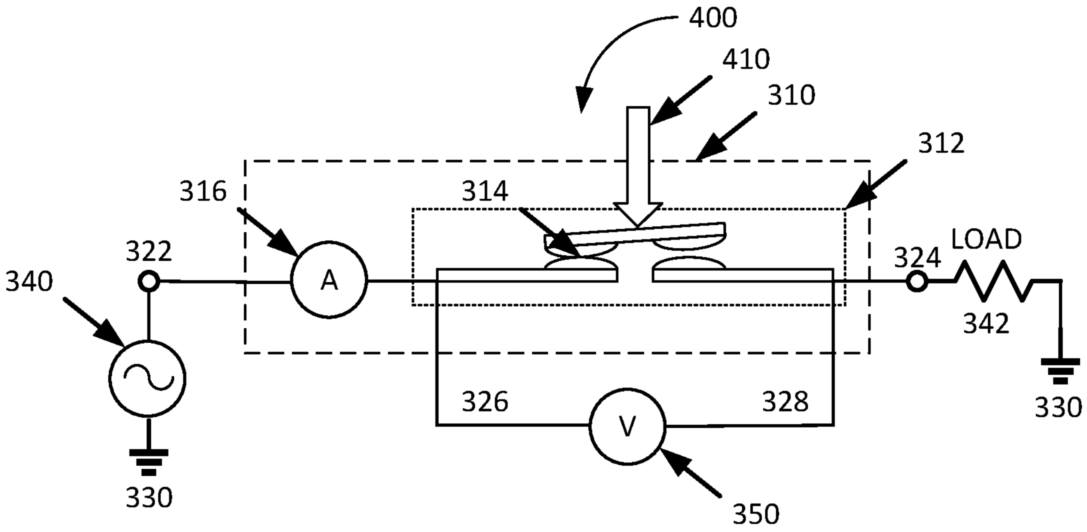

FIG. 4 illustrates the example relay system 410 of FIG. 3 within industrial automation environment 400 as a close signal 410 is transmitted to relay 312.

Figure 5:
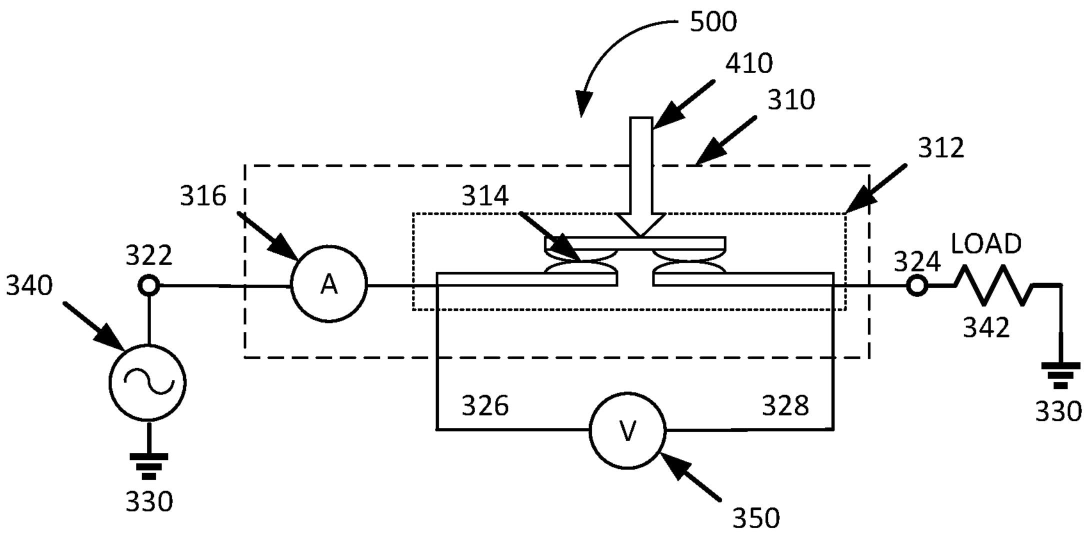

FIG. 5 illustrates the example relay system 510 of FIG. 4 within industrial automation environment 500 as relay 312 closes in response to close signal 410. At this point, relay 312 is closed, current sensor 316 measure the current flowing from power source 340 through relay 312 and load 342. Voltage sensor 350 measures zero volts across relay 312 since the relay is closed.

Figure 6:
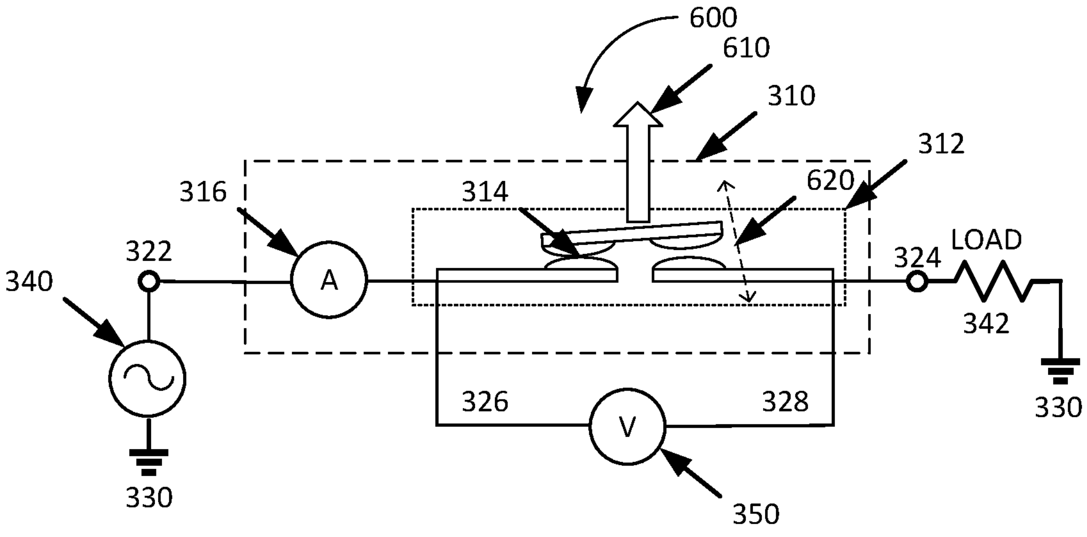

FIG. 6 illustrates the example relay system 610 of FIG. 5 within industrial automation environment 600 as an open signal 610 is transmitted to relay 312. Since relay 312 has a single weld 314, its response to open signal 610 differs from that of a non-welded relay, and this difference is detectable by current sensor 316 and voltage sensor 350.

In relays having a weld (such as relay 312) the relay is slower to open than non-welded relays resulting in current flowing through the relay after it should have opened. This is detected by current sensor 316. Also, relays having a single weld may bounce open and closed one or more times after receiving open signal 610. This bouncing is illustrated by dashed line 620. Voltage sensor 350 detects these bounces by measuring the voltage across relay 312 and detecting when the voltage across the relay returns to zero one or more times after the relay opens.

In some example embodiments, relay system 310 includes a plurality of relays and the steps illustrated in FIGS. 3-6 are performed sequentially on each of the plurality of relays. In other example embodiments, the steps illustrated in FIGS. 3-6 are performed in parallel on the plurality of relays.

In some example embodiments, the steps illustrated in FIGS. 3-6 are performed during system startup, and in some examples, these steps are performed a plurality of times to increase the probability of detecting any welds.

In response to detecting a weld, some example embodiments perform a system shutdown or disconnect the power source to prevent damage to the system and broadcast an alert message notifying users of the weld and the shutdown.

Figure 7:
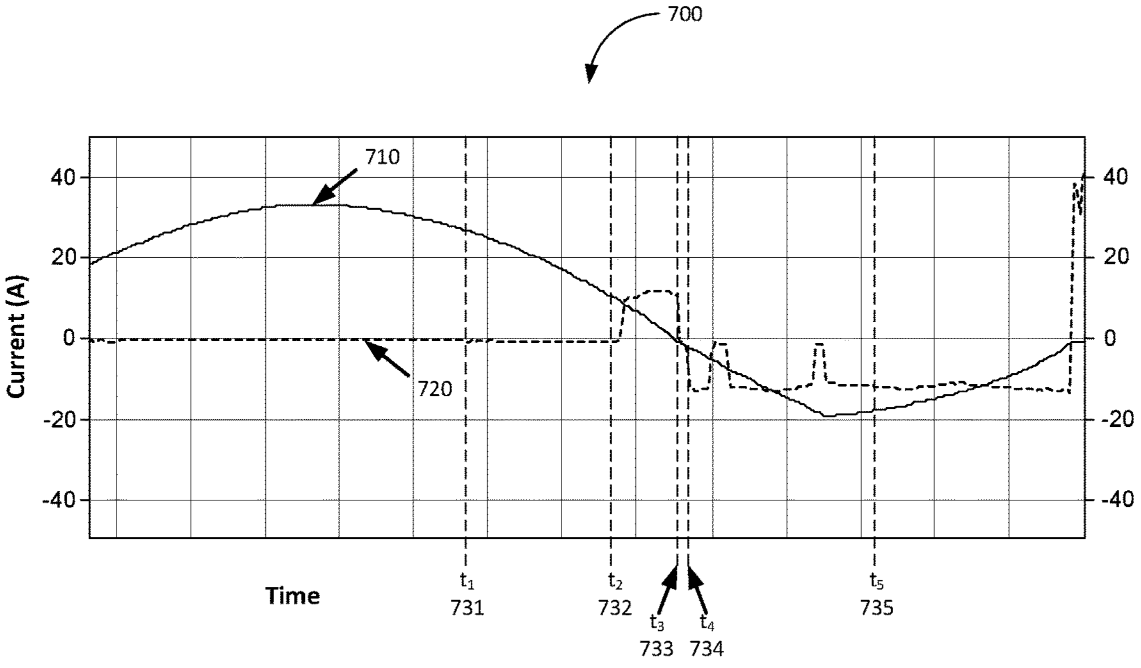
FIG. 7 illustrates a simulation of current and voltage when a relay having a welded contact is closed and opened.

FIG. 7 illustrates a simulation 700 of the outputs of current sensor 316 and voltage sensor 350 when a relay having a welded contact (such as relay 312) is closed and opened. In this illustration 700, the output of current sensor 316 (measured in amps) along the left vertical axis is illustrated as line 710. The output of voltage sensor 350 (measured in volts) along the right vertical axis is illustrated as line 720. Time is illustrated along the horizontal axis.

Initially relay 312 is closed and the voltage 720 across the relay is zero while the current 710 through relay 312 tracks the current supplied by power source 340. At time $t_1$ 731 an open signal is transmitted to relay 312. At time $t_2$ 732 relay 312 attempts to open. However, since one side of relay 312 is welded, only one side of the relay opens.

At time $t_3$ 733, the current 710 through relay 312 should be zero, however here the current 710 keeps flowing through relay 312 indicating the presence of a weld. At time $t_4$ 734, the non-welded contact of relay 312 rebounds and closed again and the voltage 720 across relay 312 is once again zero.

Between times $t_4$ 734 and $t_5$ 735 several bounces are illustrated by the voltage 720 across relay 312 decreasing below a threshold voltage, while current 710 continues to flow through relay 312, indicating a welded contact. The threshold voltage is less than the normal voltage across relay 312 when relay 312 is open and greater than zero. In some implementations, the voltage 720 across relay 312 is negative, and an absolute value of the voltage is compared to the threshold voltage.

Figure 8:
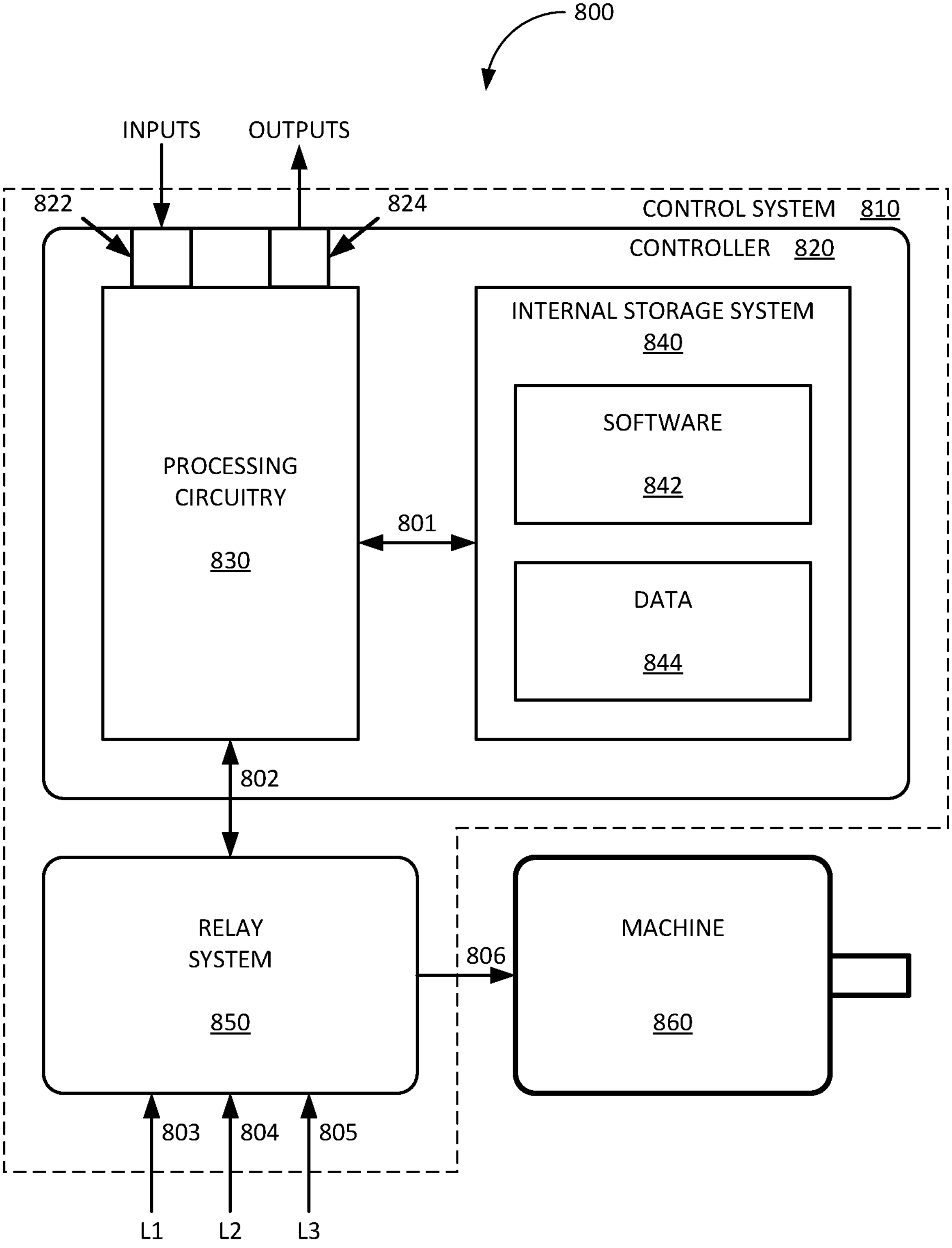
FIG. 8 illustrates an example block diagram of an industrial automation environment including a control system, configured to detect a welded relay contact, and an industrial machine.

FIG. 8 illustrates an example block diagram of an industrial automation environment 800 including a control system 810 configured to detect a welded relay contact, and an industrial machine 860. In this example embodiment, control system 810 includes controller 820 and relay system 850. Relay system 850 includes a plurality of relays and is similar to those illustrated in FIGS. 1-6 and described in detail above. In this example embodiment, relay system 850 receives three phases of power from a power source (not illustrated). Here, the three phases of power include L1 803, L2 804, and L3 805. Relay system 850 supplies power to machine 860 through link 806. In this example, link 806 includes at least three electrical conductors, each supplying a phase of power to machine 860. Relay system 850 receives commands from, and provides data to, controller 820 over link 802.

In this example embodiment, controller 820 includes processing circuitry 830, internal storage system 840, input port 822, and output port 824. Processing circuitry 830 is coupled with internal storage system 840 through link 801. Processing circuitry 830 is also coupled with relay system 850 through link 802.

Input port 822 is configured to receive control signals and data from external computing devices (not illustrated). Output port 824 is configured to provide control signals and data to external computing devices (not illustrated).

Processing circuitry 830 comprises electronic circuitry configured to direct control system 810 to control machine 860, and to detect a welded relay contact within relay system 850 by performing a weld detection check as described above. Processing circuitry 830 may comprise microprocessors and other circuitry that retrieves and executes software 842. Examples of processing circuitry 830 include general purpose central processing units, application specific processors, and logic devices, as well as any other type of processing device, combinations, or variations thereof. Processing circuitry 830 may be implemented within a single processing device but may also be distributed across multiple processing devices or sub-systems that cooperate in executing program instructions.

Internal storage system 840 may comprise any non-transitory computer readable storage media capable of storing software 842 that is executable by processing circuitry 830. Internal storage system 840 may also include various data structures 844 which comprise one or more registers, databases, tables, lists, or other data structures. Storage system 840 may include volatile and nonvolatile, removable and non-removable media implemented in any method or technology for storage of information, such as computer readable instructions, data structures, program circuits, or other data.

Storage system 840 may be implemented as a single storage device but may also be implemented across multiple storage devices or sub-systems co-located or distributed relative to each other. Storage system 840 may comprise additional elements, such as a controller, capable of communicating with processing circuitry 830. Examples of storage media include random access memory, read only memory, magnetic disks, optical disks, flash memory, virtual memory and non-virtual memory, magnetic cassettes, magnetic tape, magnetic disk storage or other magnetic storage devices, or any other medium which may be used to store the desired information and that may be accessed by an instruction execution system, as well as any combination or variation thereof.

Software 842 may be implemented in program instructions and among other functions may, when executed by controller 820 in general, or processing circuitry 830 in particular, direct controller 820, or processing circuitry 830, to operate as described herein to control machine 860, and to detect a welded relay contact within relay system 850 by performing a weld detection check. Software 842 may include additional processes, programs, or components, such as operating system software, database software, or application software. Software 842 may also comprise firmware or some other form of machine-readable processing instructions executable by elements of processing circuitry 830.

In general, software 842 may, when loaded into processing circuitry 830 and executed, transform processing circuitry 840 overall from a general-purpose computing system into a special-purpose computing system customized to operate as described herein for a controller 820 configured to control machine 860, and to detect a welded relay contact within relay system 850 by performing a weld detection check, among other operations. Encoding software 842 on internal storage system 840 may transform the physical structure of internal storage system 840. The specific transformation of the physical structure may depend on various factors in different implementations of this description. Examples of such factors may include, but are not limited to the technology used to implement the storage media of internal storage system 840 and whether the computer-storage media are characterized as primary or secondary storage.

For example, if the computer-storage media are implemented as semiconductor-based memory, software 842 may transform the physical state of the semiconductor memory when the program is encoded therein. For example, software 842 may transform the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate this discussion.

Figure 9:
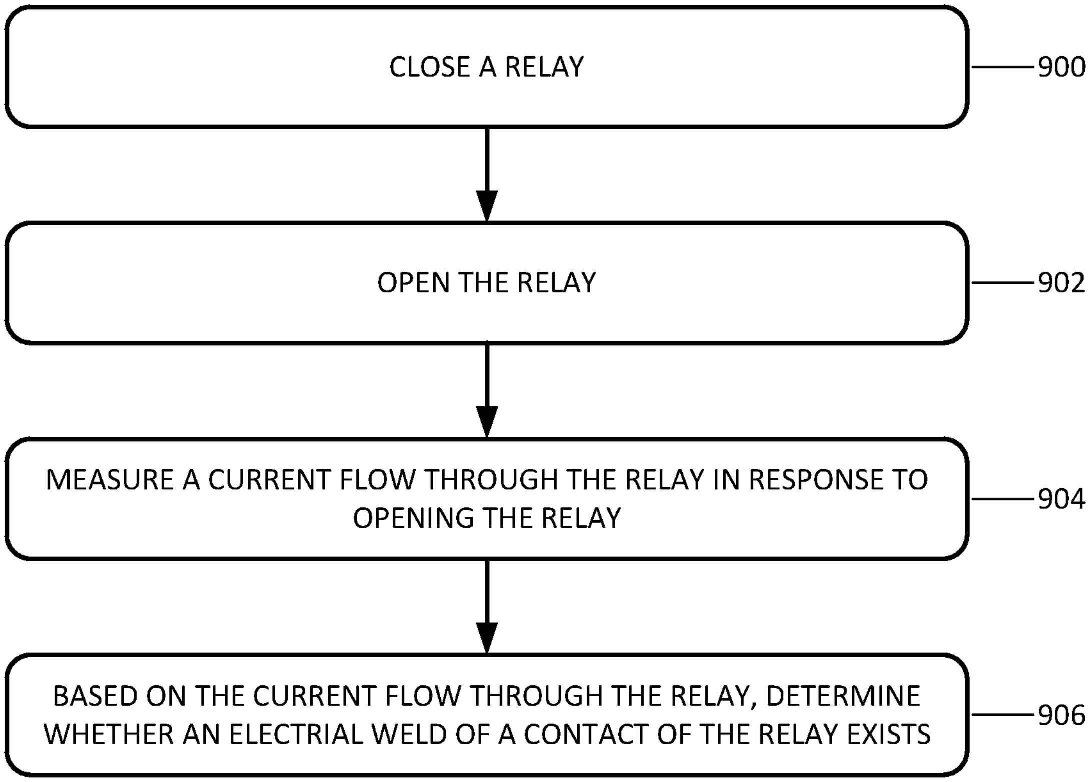
FIG. 9 illustrates a flowchart of an example method for detecting a welded relay contact by performing a weld detection check.

FIG. 9 illustrates a flowchart of an example method for detecting a welded relay contact by performing a weld detection check. In this example embodiment, controller 820 transmits a close signal 410 to relay 312, (operation 900). Relay 312 includes a first contact on an input side 326 of the relay 312 and a second contact on a load side 328 of the relay 312. The input side 322 of the relay 312 is coupled to a power source 340.

Controller 820 transmits an open signal 610 to relay 312, (operation 902). Current sensor 316 measures a current flow through relay 312 after opening the relay 312, (operation 904); and based on the current flow through the relay 312, controller 820 determines whether an electrical weld 314 of one of the first contact and the second contact of the relay 312 exists, (operation 906).

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the invention. Those skilled in the art will also appreciate that the features described above may be combined in various ways to form multiple embodiments. As a result, the invention is not limited to the specific embodiments described above, but only by the claims and their equivalents.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as relays, unless otherwise stated, are generally representative of any one or more elements configured to operate as a relay or switch. Such relay components include relays, contactors, and similar components.

Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same terminals. For example, a resistor or capacitor shown and described herein as a single component may instead be multiple resistors or capacitors, respectively, coupled in series between the same two terminals as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A system, comprising:

a relay system, comprising a relay, wherein the relay comprises a double break contact relay having:
 a first contact on an input side of the relay, the input side coupled to a power source, and
 a second contact on a load side of the relay coupled to a load; and
a controller, comprising:
 one or more processors; and
 a memory having stored thereon instructions that, upon execution by the one or more processors, cause the one or more processors to perform a weld detection check comprising:
  monitor a current flow from the power source through the relay;
  monitor a voltage between the first contact and the second contact of the relay;
  transmit a close signal to the relay, wherein the monitored voltage is zero when the relay is closed;
  transmit an open signal to the relay; and
   determine that an electrical weld of one of the first contact and the second contact of the relay exists based on detecting, following the open signal, both:
   the voltage decreasing below a threshold voltage, and
   the current flow being non-zero while the voltage is below the threshold voltage.

2. The system of claim 1, wherein determining that an electrical weld of one of the first contact and the second contact of the relay exists comprises:

detecting a response time following the open signal, and
determining the response time is above a threshold response time.

3. The system of claim 1, wherein:

the relay system comprises a plurality of relays, wherein each of the plurality of relays comprises a double break contact relay having:
 a first contact on an input side coupled to a respective phase of a three-phase power source, and
 a second contact on the load side coupled to the load.

4. The system of claim 3, wherein;

the instructions comprise further instructions that, upon execution by the one or more processors, cause the one or more processors to:
 perform the weld detection check in parallel on each relay of the plurality of relays.

5. The system of claim 1, wherein determining that an electrical weld of one of the first contact and the second contact of the relay exists comprises detecting the voltage decreasing below the threshold voltage two or more times following the open signal.

6. The system of claim 1, wherein the instructions comprise further instructions that, upon execution by the one or more processors, cause the one or more processors to:

determine that an electrical weld of both the first contact and the second contact of the relay exists based on detecting:

the voltage between the first contact and the second contact of the relay remaining below the threshold voltage following the open signal.

7. The system of claim 3, wherein;

the instructions comprise further instructions that, upon execution by the one or more processors, cause the one or more processors to perform the weld detection check on each relay of the plurality of relays sequentially.

8. The system of claim 1, wherein the weld detection check is performed on startup or shutdown of the system.

9. The system of claim 1, wherein the weld detection check is performed a plurality of times.

10. The system of claim 1, wherein the instructions comprise further instructions that, upon execution by the one or more processors, cause the one or more processors to:

in response to detecting the electrical weld, disconnecting the power source to shut down the system.

11. The system of claim 1, wherein the system is an industrial automation motor starter.

12. The system of claim 1, wherein the load is an electrical motor.

13. A method for detecting a welded relay contact, the method comprising:

performing a weld detection check, comprising:

closing a relay, wherein:

the relay is a double break contact relay comprising a first contact on an input side of the relay and a second contact on a load side of the relay, the input side of the relay is coupled to a power source, and the load side of the relay is coupled to a load;

opening the relay;

measuring a current flow through the relay in response to opening the relay;

measuring a voltage between the first contact and the second contact of the relay, wherein the voltage is approximately zero when the relay is closed; and determining that an electrical weld of one of the first contact and the second contact of the relay exists based on detecting, following opening the relay, both:

the voltage decreasing below a threshold voltage, and the current flow being non-zero while the voltage is below the threshold voltage.

14. The method of claim 13, wherein determining that an electrical weld of one of the first contact and the second contact of the relay exists comprises:

detecting a response time following opening the relay, and determining the response time is above a threshold response time.

15. The method of claim 13, wherein:

the relay is one of a plurality of relays, wherein each of the plurality of relays comprises a double break contact relay having:

a first contact on an input side coupled to a respective phase of a three-phase power source, and a second contact on the load side coupled to the load.

16. The method of claim 15, further comprising:

performing the weld detection check on each of the plurality of relays.

17. The method of claim 13, wherein determining that an electrical weld of one of the first contact and the second contact of the relay exists comprises detecting the voltage decreasing below the threshold voltage two or more times following opening the relay.

18. The method of claim 13, further comprising:

determining that an electrical weld of both the first contact and the second contact of the relay exists based on detecting:

the voltage between the first contact and the second contact of the relay remaining below the threshold voltage following opening the relay.

19. The method of claim 13, further comprising:

performing the weld detection check in response to startup of a system comprising a plurality of relays.

20. The method of claim 13, further comprising:

in response to detecting the electrical weld, automatically disconnecting the power source to shut down a system comprising a plurality of relays.

* * * * *